United States Patent
Hilligoss et al.

(10) Patent No.: US 11,791,502 B2
(45) Date of Patent: Oct. 17, 2023

(54) DETECTING THERMAL EVENTS IN BATTERY PACKS

(71) Applicant: Cummins Inc., Columbus, IN (US)

(72) Inventors: Lawrence Hilligoss, Ashland, OR (US); Daniel Riegels, Ashland, OR (US); Matthew D. Nelson, Medford, OR (US); Tyler A. Rash, Columbus, IN (US); Rick Lewis, Medford, OR (US)

(73) Assignee: CUMMINS INC., Columbus, IN (US)

( * ) Notice: Subject to any disclaimer, the term of this patent is extended or adjusted under 35 U.S.C. 154(b) by 119 days.

(21) Appl. No.: 17/381,928

(22) Filed: Jul. 21, 2021

(65) Prior Publication Data

US 2022/0077507 A1   Mar. 10, 2022

(30) Foreign Application Priority Data

Jul. 30, 2020   (GB) ..................................... 2011897

(51) Int. Cl.
| | |
|---|---|
| *H01M 10/42* | (2006.01) |
| *H01M 10/647* | (2014.01) |
| *G01R 31/382* | (2019.01) |
| *H01M 50/502* | (2021.01) |
| *H01M 50/209* | (2021.01) |

(Continued)

(52) U.S. Cl.
CPC ........ *H01M 10/425* (2013.01); *G01R 31/382* (2019.01); *H01M 10/482* (2013.01); *H01M 10/486* (2013.01); *H01M 10/647* (2015.04); *H01M 50/209* (2021.01); *H01M 50/502* (2021.01); *H02J 7/0029* (2013.01); *H01M 2010/4271* (2013.01); *H01M 2200/106* (2013.01)

(58) Field of Classification Search
CPC ............ H01M 50/502; H01M 50/209; H01M 10/425; H01M 10/647; H01M 10/482; H01M 10/486; G01R 31/382
See application file for complete search history.

(56) References Cited

U.S. PATENT DOCUMENTS

| | | | |
|---|---|---|---|
| 5,764,063 | A | 6/1998 | Katou et al. |
| 6,255,826 | B1 | 7/2001 | Ohsawa |

(Continued)

FOREIGN PATENT DOCUMENTS

| | | |
|---|---|---|
| CN | 104795855 A | 7/2015 |
| CN | 111370784 A | 7/2020 |

(Continued)

OTHER PUBLICATIONS

Search Report issued by the United Kingdom Intellectual Property Office, dated Jan. 18, 2021, for Application No. GB2011897.2; 5 pages.

*Primary Examiner* — Karie O'Neill Apicella
(74) *Attorney, Agent, or Firm* — Faegre Drinker Biddle & Reath LLP

(57) ABSTRACT

A battery module for use in a battery pack is disclosed. The battery module (12, 12') comprises a plurality of battery cells (24, 25) and a sensing circuit (62) extending across the battery cells. A monitoring unit (46) is connected to the sensing circuit. The monitoring unit comprises a continuity detector (66) arranged to detect a break in continuity of the sensing circuit (62). This can allow a thermal event occurring in one of the plurality of cells to be detected.

17 Claims, 17 Drawing Sheets

(51) Int. Cl.
*H01M 10/48* (2006.01)
*H02J 7/00* (2006.01)

(56) References Cited

U.S. PATENT DOCUMENTS

| | | |
|---|---|---|
| 6,597,276 B1 | 7/2003 | Chiang et al. |
| 2007/0029976 A1 | 2/2007 | Garcia et al. |
| 2010/0302051 A1 | 12/2010 | Hermann |
| 2010/0309949 A1 | 12/2010 | Akaboshi et al. |
| 2011/0210703 A1 | 9/2011 | Souza et al. |
| 2019/0379089 A1* | 12/2019 | Kim ..................... H02H 7/18 |
| 2020/0313139 A1* | 10/2020 | Patterson ............ H01M 50/519 |

FOREIGN PATENT DOCUMENTS

| | | |
|---|---|---|
| FR | 2967823 A | 5/2012 |
| GB | 2354587 A | 3/2001 |

\* cited by examiner

DETECTING THERMAL EVENTS IN BATTERY PACKS

CROSS-REFERENCE TO RELATED APPLICATIONS

The present application claims benefit of United Kingdom Application No. 2011897.2, filed Jul. 30, 2020, the complete disclosure of which is hereby expressly incorporated by reference herein.

FIELD OF THE DISCLOSURE

The present disclosure relates to techniques for detecting uncontrolled thermal events in battery packs. The present disclosure has particular, but not exclusive, application in battery packs for use in traction applications such as electric or hybrid electric vehicles, construction equipment, and so forth, as well as in stationary battery applications.

BACKGROUND

Electric vehicles and hybrid electric vehicles, such as cars, buses, vans and trucks, use battery packs that are designed with a high ampere-hour capacity in order to give power over sustained periods of time. A battery pack typically comprises a large number of individual electrochemical cells connected in series and parallel to achieve the total energy, voltage and current requirements. To assist in manufacturing, assembly and servicing, the cells in a battery pack may be grouped into modules. The modules may include a support structure and a battery management unit to manage cell charge and discharge.

In order to help with packing efficiency, battery modules often use flat battery cells such as prismatic cells or pouch cells. Prismatic cells are electrochemical cells (typically lithium-ion) contained in a rectangular can, while pouch cells are contained in a pouch of flexible material. Typically, a number of such cells are stacked together inside a support structure to form a battery module. The cells in the module are connected in series and parallel to achieve the target voltage. Other types of battery pack use a plurality of cylindrical battery cells connected in the appropriate configuration. Especially for traction applications, both the modules and the cells within may be arranged so that the pack is space conforming, especially in applications in which space is at a premium.

Battery packs for use in traction applications typically contain a large number of cells in proximity, in order to provide energy dense electrical storage. However, if a cell is short-circuited or exposed to high temperature, exothermic reactions can be triggered, which may result in the cell overheating or catching fire. The proximity of the individual cells means that if one cell catches fire, the fire can easily spread through the module in a cascading fashion. Furthermore, due to the proximity of the modules in a battery pack, the fire can potentially spread to other modules. The cascading of these thermal events is known as battery pack Thermal Runaway.

In the case of automotive applications, fast and reliable detection of thermal runaway events may be required in order to give the driver and passengers time to safely leave the vehicle before hazardous situations occur.

It is known to provide a battery pack with temperature sensors which can detect rises in temperature caused by thermal runaway events. For example, a battery module may include one or more temperature sensors which can be used by the battery management unit to detect a rise in temperature of the battery module, which rise in temperature may potentially lead to a thermal runaway event.

However, a disadvantage of detecting temperature changes in the battery module as a whole is that the cell which initially fails may be separated by both thermal mass and distance from the temperature sensor. As a consequence, the thermal runaway event may already be underway before a corresponding rise in temperature is detected, leading to a delay before an alarm can be issued. On the other hand, if each cell were provided with a temperature sensor, this would increase the size, cost and complexity of the battery pack, which are important considerations in the automotive space.

It would therefore be desirable to provide techniques for early detection of a thermal event which can be implemented in a cost effective and space efficient manner.

SUMMARY

According to one aspect of the present disclosure there is provided a battery module comprising:
  a plurality of battery cells;
  a sensing circuit extending across the plurality of battery cells; and
  a monitoring unit connected to the sensing circuit,
  wherein the monitoring unit is arranged to detect a change in state of the sensing circuit.

The present disclosure may provide the advantage that, by providing a sensing circuit extending across the plurality of battery cells and a monitoring unit arranged to detect a change in state of the sensing circuit, it may be possible to detect a thermal event occurring in one of the plurality of cells by monitoring a single parameter, or a reduced number of parameters, for all of the plurality of cells. Thus, the present disclosure may provide the advantage that early detection of an imminent or likely thermal runaway event can be achieved without adding significantly to the size, cost and complexity of the battery module.

In one embodiment, the monitoring unit comprises a continuity detector arranged to detect a break in continuity of the sensing circuit. This may allow a thermal event occurring in one of the plurality of cells to be detected by monitoring a single parameter, namely, the continuity of the sensing circuit.

The monitoring unit is preferably arranged to produce an alarm signal when a change in break in continuity of the sensing circuit is detected. This may allow a warning of an imminent thermal runaway event to be provided.

The alarm signal could be used to provide a local alarm. For example, a warning could be provided to occupants of a vehicle. Alternatively, or in addition, in the event of detecting a state of change in the sensing circuit, a notification system may notify a central system such as a dispatch center/fleet owner/fleet operator/emergency responder of the event along with the location/GPS coordinates. This may enable the fleet owner to send a replacement vehicle and/or emergency personnel to rectify the situation (if needed).

The sensing circuit may comprise a continuous severable component. The continuous severable component preferably extends across a vent path of each of the plurality of battery cells. The continuous severable component may be arranged to sever, for example, when a battery cell heats up or vents due to a thermal event. For example, the severable component may be arranged to be severed by a venting action of a cell undergoing a thermal event. In this case, the severable component may be arranged to be severed by the venting action due to the temperature of the vented constituents, the momentum and subsequent force of the vented constituents exerted on the severable component, the chemical nature of the severable component and the vented constituents, or all combinations or partial combinations thereof.

The continuous severable component may be, for example, an electrical conductor. This may allow a break in continuity of the sensing circuit to be detected by monitoring the continuity of an electrical signal through the electrical conductor. For example, the monitoring unit may be arranged to apply an electrical signal to the electrical conductor, and to detect an open circuit in the electrical conductor. This may be done, for example, by applying a voltage and detecting whether there is a current.

In one embodiment, the continuous severable component comprises a trace on a circuit board. Typically, a circuit board is already provided as part of a battery module design, for example, in order to bring voltage measurements to a battery management unit. Thus, this embodiment may allow the sensing circuit to be implemented with minimal or no increase in the size and cost of the battery module.

Preferably, the circuit board comprises a plurality of vent holes, each vent hole associated with a battery cell, and the continuous trace spans a plurality of vent holes. This can allow the trace to be supported by the circuit board, while being exposed to the battery cells in the locations where the battery cells are likely to vent should a thermal event occur. This can facilitate severing of the trace when a battery cell vents due to a thermal event.

The trace on the circuit board may comprise a stress concentration feature where it spans a vent hole. The stress concentration feature may comprise, for example, an area where the trace has a reduced cross section. This may be formed, for example, by providing a notch or a hole in the trace. The stress concentration feature may allow the trace to break more readily when a cell vents.

The battery module may comprise a laminated busbar. The laminated busbar may be used, for example, to make electrical connections between two or more battery cells, in order to provide the appropriate series and/or parallel connections of the battery cells in the battery module. In this case, the circuit board may be part of the laminated busbar. This can allow the circuit board to be provided as part of an existing component, thereby reducing cost and complexity.

Alternatively, or in addition, the circuit board may be arranged to bring electrical signals from the battery cells to a battery management unit. Such a circuit board may already be provided as part of the battery module. This may therefore allow the sensing circuit to be provided using little or no additional components.

The monitoring unit may be part of a battery management unit, which may be provided to monitor and manage cell charge and/or other aspects of cell operation. Thus, the monitoring unit may at least partially make use of at least some existing components.

In any of the above arrangements, the monitoring unit may be arranged to receive an input from at least one other sensor, such as a temperature sensor, pressure sensor, strain sensor, chemical sensor, opacity sensor, voltage sensor, current sensor, or any other appropriate type of sensor. This can allow more than one factor to be taken into account when producing the alarm signal, and thus may allow increased redundancy and/or a reduction in false alarms.

The battery cells are preferably of a type which may be stacked, which may help with packing efficiency. For example, the battery cells may be prismatic cells or pouch cells. Preferably, the plurality of battery cells are stacked, and each cell is orientated such that a vent path is in a direction of the sensing circuit. However, the principles of the present disclosure may also be used with other types of cell, such as cylindrical cells.

The sensing circuit may extend across some or all of the battery cells in the battery module. If desired, two or more sensing circuits could be provided, each with a monitoring unit. Each of the sensing circuits may extend across some or all of the battery cells. This may help to provide redundancy and/or help reduce false positives.

In alternative arrangements, the sensing circuit may comprise a different type of continuous severable component, such as an electrically conductive wire, or an optical fibre. In the case of an optical fibre, the continuity detector may detect whether or not light is being transmitted through the optical fibre. In either case, a stress concentration feature may be provided where the sensing circuit is in a vent path.

In other arrangements, the severable component may comprise a plurality of severable elements connected in series. In this case, each of the plurality of severable elements may be associated with at least one battery cell. Each of the severable elements may be arranged to sever when the battery cell heats up or vents.

In another embodiment, the sensing circuit comprises a plurality of sensing elements connected in series. In this case, each of the plurality of sensing elements may be associated with at least one battery cell. This may facilitate detection of a thermal event in an individual battery cell, while monitoring the sensing circuit as a whole.

Preferably, the change in state of the sensing circuit is caused by a change in state of one or more of the sensing elements. The change in state of a sensing element may be for example a change in resistance of the sensing element or a severing of the sensing element. This may provide a convenient way of detecting the change in state using an appropriate monitoring unit.

The sensing elements are preferably connected in series along a single conductive path. Thus, the monitoring unit may monitor a series connection of a plurality of sensing elements, which may allow a thermal event occurring in one of plurality of cells to be detected by monitoring a single parameter or a reduced number of parameters (in comparison to the number of cells).

Alternatively, or in addition, it may be possible for at least some of the sensing elements to be connected in parallel. Thus, the sensing circuit may comprise a plurality of sensing elements in parallel.

The monitoring unit may be arranged to detect a change in a single parameter of the sensing circuit. For example, the monitoring unit may be arranged to detect a change in the resistance and/or the continuity of the sensing circuit in order to detect a thermal event occurring in one (or more) of the plurality of cells. This may help to achieve a simple and inexpensive design.

The monitoring unit may be arranged to detect a change in an electrical parameter of the sensing circuit. For example, the monitoring unit may be arranged to detect a change in resistance, current and/or voltage of the sensing circuit. For example, in one embodiment, the monitoring unit is arranged to detect when the resistance of the sensing circuit exceeds a threshold. However, other parameters could be used as well or instead.

In any of the above arrangements, the monitoring unit may be arranged to monitor a rate of change, or any other time derivative, of a parameter of the sensing circuit. For example, the monitoring unit may be arranged to monitor a rate of change of the resistance of the sensing circuit, and to detect when the rate of change exceeds a threshold. This may help to avoid false positive due to, for example, changes in overall environmental conditions such as ambient temperature.

The sensing circuit may be supported by a board which is used to connect the battery cells. For example, the sensing circuit may be supported by a laminated busbar which is used to connect the cells in the appropriate series and/or parallel configuration. This may allow the sensing circuit to extend across the plurality of battery cells using an existing component.

The sensing circuit may be provided on a circuit board. The circuit board may be, for example, a flexible printed circuit board, and may be part of or attached to a laminated busbar. The circuit board may be used, for example, to bring voltages and/or other signals to a battery management unit. This may allow the sensing circuit to be at least partially implemented using existing components.

The sensing circuit may extend across a vent path of each of the plurality of battery cells. For example, wherein the sensing circuit comprises a plurality of sensing elements, each of the sensing elements may be located in a vent path of a battery cell. The vent path of a cell is preferably a path in which gases will be expelled from the cell in the case of thermal runaway. In the case of a battery cell with a vent (such as a prismatic cell), the sensing element may be located adjacent to the vent. In the case of a pouch cell, the sensing element may be located at the top of the cell where the electrodes are located. This can allow the venting of gases during thermal runaway to be readily detected.

Conveniently, each sensing element may be provided at a vent hole in a circuit board, each vent hole associated with a battery cell.

In one embodiment, the sensing elements are sensors. The sensors are preferably components arranged to sense changes in an environmental parameter such as temperature or pressure. Thus, the sensing circuit may comprise a plurality of sensors connected in series. The sensors are preferably connected in series along a single conductive path. The monitoring unit may be arranged to detect when the resistance of the series connected sensors exceeds a threshold.

The change in state of the sensor circuit may be caused by a change in temperature of one or more of the series connected sensors. Thus, the sensors may be temperature sensors. In this case, each of the temperature sensors is preferably able to thermally sense a battery cell or the cell's vented species (for example, gases vented from the cell during a thermal runaway event). This may allow a rise in temperature of one of the cells, which could lead to a thermal runaway event, to be detected before the thermal runaway event has necessarily spread to other cells. Furthermore, this may be achieved by monitoring the sensing circuit as a whole, rather than each individual cell. Thus, this arrangement may help to provide an early indication of an imminent thermal runaway event, in a cost effective and space efficient manner.

For example, each of the temperature sensors may be in thermal contact with a battery cell. It will be appreciated that, by "thermal contact" it is not necessarily meant that the sensors are in physical contact with the battery cell, and contact may be established through an intermediary or through advection, convection, conduction and/or radiation as well as or instead of conduction.

Preferably, the sensors are nonlinear, that is, they may have a non-linear response to a parameter being measured. In this case, the sensors may become non-linear above the normal operating range of the system. For example, the sensors may have a non-linear resistance to temperature response, that is, a rate of change of resistance with temperature may increase when the temperature is above a threshold. Preferably, the sensors become non-linear above a normal temperature range of the battery module. As an example, the sensors may be non-linear above 50° C., 60° C., 70° C., 80° C., 90° C., 100° C., or any other value. This may help to provide a quick detection of an imminent thermal runaway event, while helping to avoid false positives due to an increase in temperature of the battery module as a whole.

In a preferred embodiment, the sensors are thermistors. This can allow a change in temperature of one of the battery cells to be detected by monitoring the total resistance of a chain of series connected thermistors. Thus, this embodiment may provide a simple, convenient, cost effective and space efficient way of detecting a thermal event in one (or more) of the battery cells.

Preferably, the sensors are positive temperature coefficient (PTC) thermistors. Thus, the sensor circuit may comprise a chain of series connected positive temperature coefficient thermistors. In this case, the monitoring unit may be arranged to detect when the resistance of the chain of positive temperature coefficient thermistors exceeds a threshold. Typically, the resistance of a PTC thermistor increases rapidly with temperature. Thus, this embodiment may provide the advantage that a change in state of the sensing circuit, corresponding to a rise in temperature of one (or more) of the battery cells, can be readily detected. Furthermore, should one of the thermistors fail or become disconnected, for example due to venting of a cell, then the resistance of the sensing circuit will also increase to an open circuit state. Thus, detecting whether the resistance of a chain of PTC thermistors exceeds a threshold may also allow the severing or failure of one (or more) of the thermistors to be detected.

Alternatively, the sensors could be other types of temperature sensor such as negative temperature coefficient (NTC) thermistors, thermocouples or infrared (IR) sensors. For example, the sensing circuit may comprise a plurality of thermocouples connected in series. In this case, the sensing circuit may comprise alternating types of thermocouple wire connected in series, and the sensing elements may be the thermocouple junctions. In such an arrangement, the monitoring unit may detect a temperature differential in the battery module. This differential may be compared to a nominal temperature within the pack to make a decision. Since a thermal runaway event is likely to start in an individual cell, this arrangement may help to provide an early indication of an imminent thermal runaway event.

In other alternatives, rather than temperature sensors, and any other type of sensor such as pressure sensors, strain sensors, chemical sensors, opacity sensors or any other appropriate type of sensor could be used as well or instead.

In the case where the monitoring unit is arranged to detect when a parameter of the sensing circuit exceeds a threshold, the monitoring unit may vary the threshold based on input received from at least one other sensor. For example, the monitoring unit may receive an input from a temperature sensor which is arranged to monitor ambient temperature or an average temperature of a battery pack. In this case the threshold may be varied in dependence on the ambient or average temperature. For example, the threshold may be increased if the ambient or average temperature increases. This may help to avoid false positives, while allowing early detection of an imminent or likely thermal runaway event to be achieved. If desired, other parameters such as pressure and/or current drawn by or supplied to the battery cells could be used to vary the threshold as well or instead.

According to another aspect of the present disclosure there is provided a battery pack comprising a plurality of battery modules according to any of the preceding claims. The battery pack may include a battery management unit. The battery management unit may be arranged to receive alarm signals from each of the battery modules, and to generate an external alarm signal in dependence thereon.

The principle of measuring a single parameter of a plurality of series connected elements that become non-linear above the normal operating range of the system can be extended to any system that needs this type of surveillance. For example, this principle could be used to detect overheating in a multiple high current power connector system, or to detect overheating in a multiple high current electrical power bolted joints system, or any other system having a plurality of components which may be subject to overheating, and where it may be desirable to detect overheating of one or more of the plurality of components.

Thus, according to another aspect of the present disclosure there is provided a system for monitoring a plurality of components for a change in an environmental parameter, the system comprising:
 a plurality of sensor elements connected in series, each of the sensor elements associated with at least one of the components; and
 a monitoring unit connected to the plurality of series connected sensor elements,
 wherein the monitoring unit is arranged to detect a change in state of the plurality of series connected sensor elements.

The environmental parameter may be, for example, temperature or pressure. The change in state of the plurality of series connected sensor elements may be, for example, a change in resistance.

The sensor elements preferably have a non-linear response to the environmental parameter. For example, the sensor elements may have a non-linear resistance to temperature response. In one example, the sensor elements are (non-linear) PTC thermistors.

Preferably the sensor elements become non-linear above the normal operating range of the system (for example, above the normal temperature range). In this case, each sensor's non-linear response outside (over or under) the normal operating range may facilitate the detection of a single undesired system event with a single measurement of the series sensing elements.

The monitoring unit may be arranged to detect when a parameter of the series connection of sensor elements exceeds a threshold. For example, the monitoring unit may be arranged to detect when the resistance of the plurality of sensor elements exceeds a threshold.

Corresponding methods may also be provided. Thus, according to another aspect of the present disclosure there is provided a method of detecting a thermal event in a battery module comprising a plurality of battery cells, the method comprising:
 monitoring a sensing circuit, the sensing circuit extending across the plurality of battery cells; and
 detecting a change in state of the sensing circuit.

The method may further comprise producing an alarm signal when a change in state of the sensing circuit is detected.

Features of one aspect of the disclosure may be used with any other aspect. Any of the apparatus features may be provided as method features and vice versa.

BRIEF DESCRIPTION OF THE DRAWINGS

Preferred features of the present disclosure will now be described, purely by way of example, with reference to the accompanying drawings, in which.

DETAILED DESCRIPTION OF EMBODIMENTS OF THE DISCLOSURE

Figure 1:
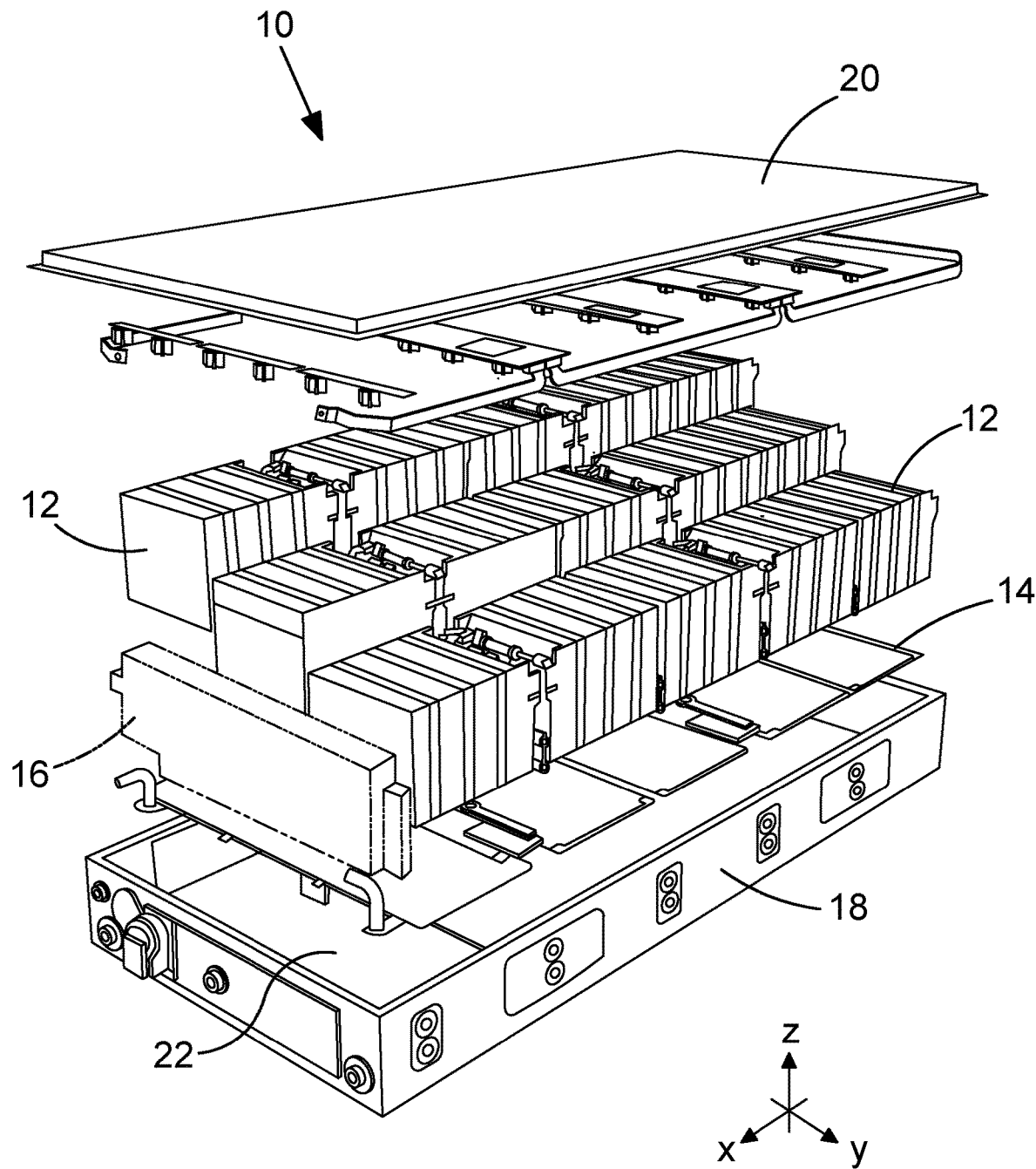
FIG. 1 shows an example of a battery pack.

FIG. 1 shows an example of a battery pack. The battery pack of FIG. 1 is designed to be used with electric and hybrid vehicles, particularly in high horsepower applications as buses, trucks, vans, construction equipment, and so forth.

Referring to FIG. 1, the battery pack 10 comprises a plurality of battery modules 12, a plurality of cooling plates 14, a battery management system 16, a surround frame 18, a top panel 20 and a bottom panel 22. In this example, fifteen battery modules 12 are provided in five rows of three modules. Each row of three battery modules 12 is located on a corresponding cooling plate 14. The cooling plates 14 are hollow to allow the flow of coolant. The battery management system 16 is located at one end of the battery pack. In the assembled state, the top panel 20 and the bottom panel 22 are attached to the top and bottom respectively of the frame 20. The battery modules 12, cooling plates 14 and battery management system 16 are housed inside the frame 18 and panels 20, 22.

Figure 2:
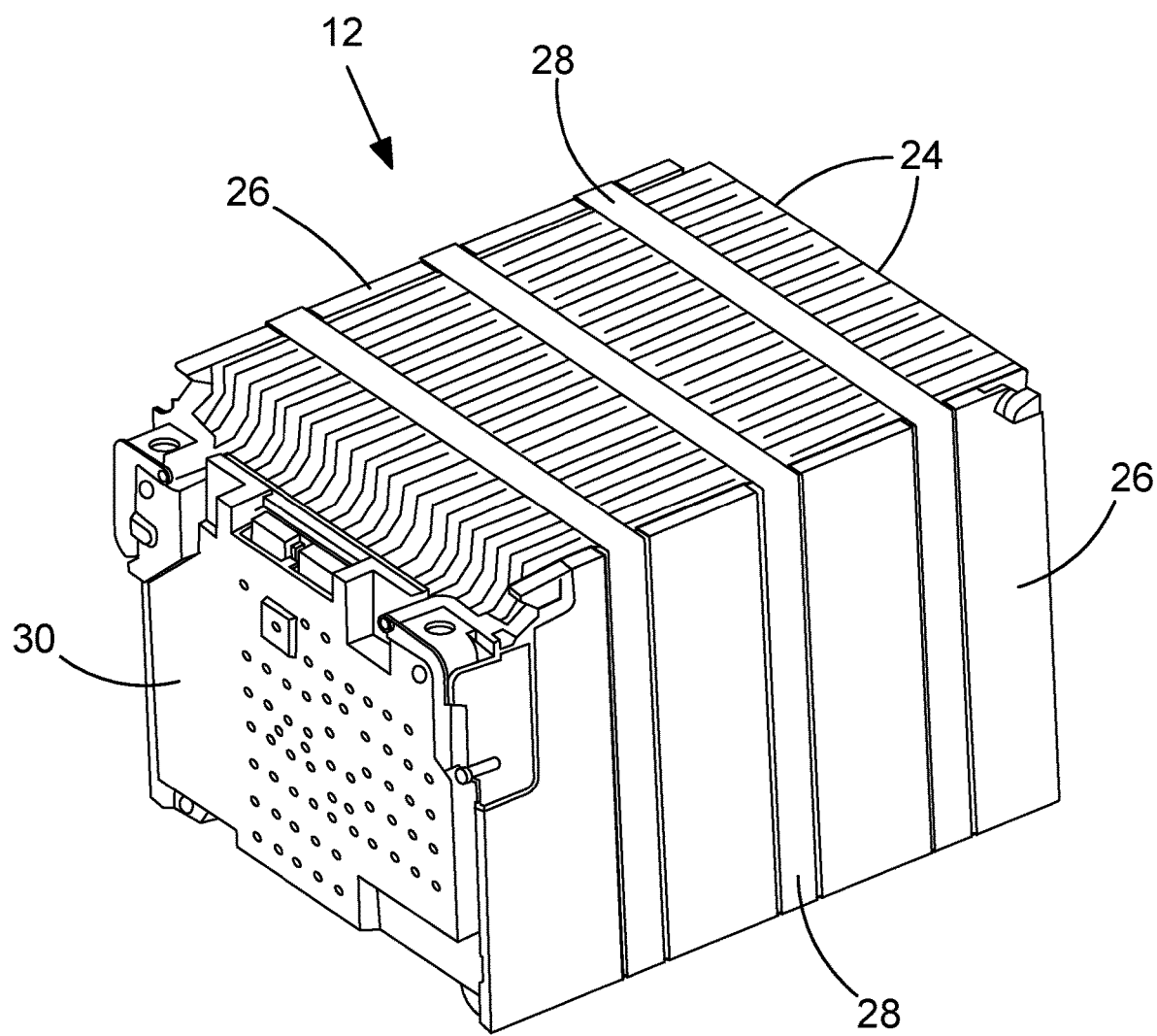
FIG. 2 shows an example of a battery module.

FIG. 2 shows an example of a battery module 12. In this example the battery module 12 comprises twenty-four battery cell units 24 stacked together side by side. The battery cell units 24 are electrically connected in series and/or parallel to achieve the target pack voltage. End plates 26 are provided on each side of the module. The battery cell units 24 and end plates 26 are held together by steel bands 28. A removable cover 30 is provided at one end of the module. A battery management unit is integrated with the module 12 inside the removable cover 30 to monitor and manage cell charge and other aspects of cell operation.

Figure 3:
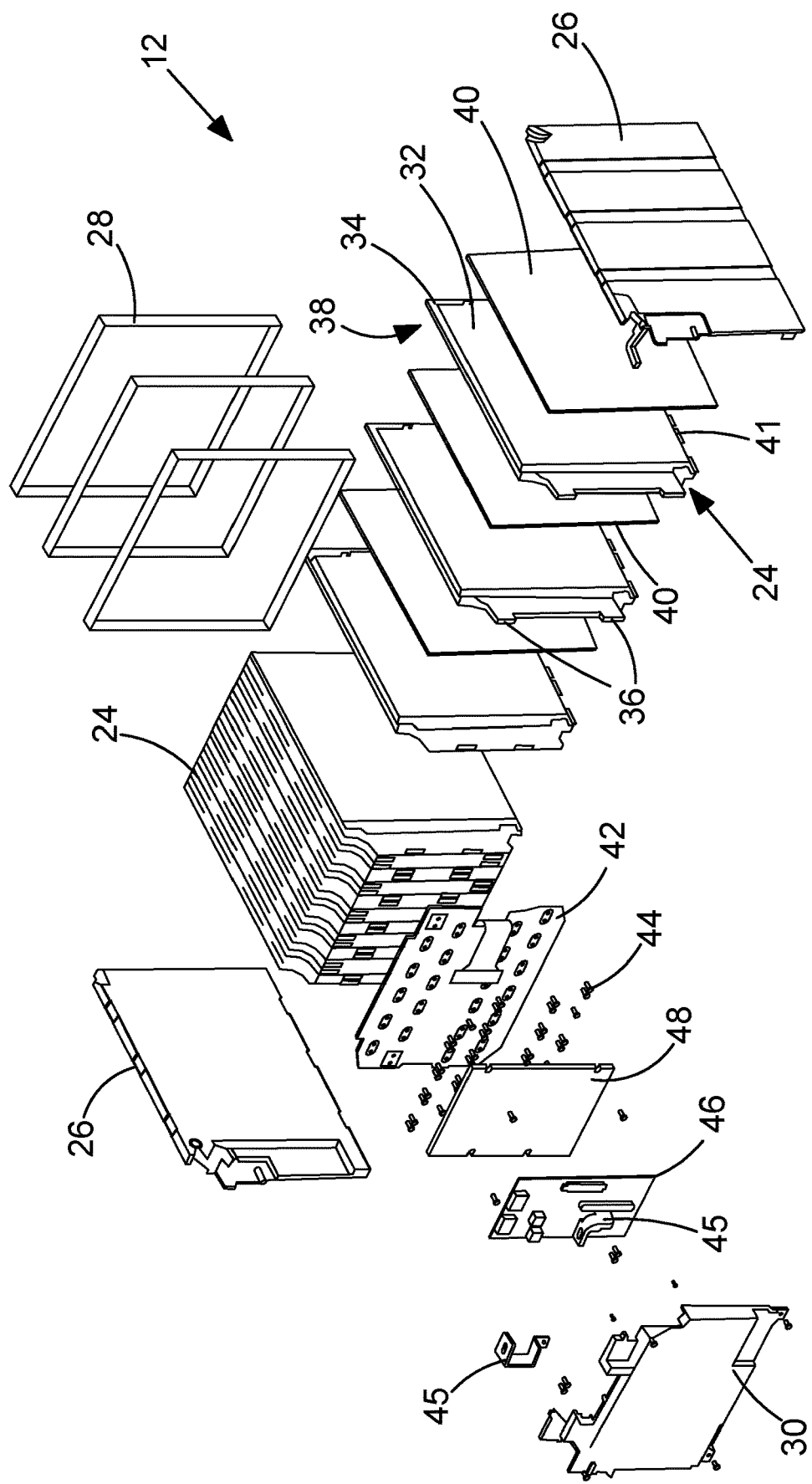
FIG. 3 is an exploded view of the battery module of FIG. 2.

FIG. 3 is an exploded view of the battery module of FIG. 2. Referring to FIG. 3, the battery module 12 is formed by stacking together a plurality of battery cells 24. Each of the battery cell 24 is in the form of a pouch cell 32 held within a cell tray 34. In this example the cell trays 34 are made from a plastic polymer material such as a thermoplastic. Each of the battery cells 24 includes electrical terminal blocks 36, which are used to make electrical connections to the pouch cell 32. Each of the battery cells 24 also has a cooling sheet 38 which is used to conduct heat away from the pouch cell 32. A compression foam expansion pad 40 is provided between adjacent battery cells.

In the arrangement of FIG. 3, a laminated busbar 42 is used to electrically connect the various battery cells 24. The laminated busbar 42 is connected to the battery cells 24 by means of electrically conducting pins 44. The pins 44 pass through holes in the busbar 42 and into corresponding holes in the terminal blocks 36 of the battery cells in order to provide electrical and mechanical connections between the two. The laminated busbar 42 includes electrical conductors which connect the battery cells 24 in the required series and/or parallel connections to achieve the target voltage. The laminated busbar 42 also connects to positive and negative terminals 45 which provide electrical connections to and from the battery module.

Also shown in FIG. 3 is a battery management unit 46. The battery management unit 46 includes a processor with the appropriate software, along with memory and other components, which are used to monitor and manage cell charge and other aspects of cell operation. The battery management unit 46 is provided on a circuit board, which is mounted on the laminated busbar 42 via an electrically insulating barrier plate 48. The battery management unit 46 is protected by removable cover 30. The removable cover 30 is made from a plastic polymer material such as a thermoplastic.

Figure 4:
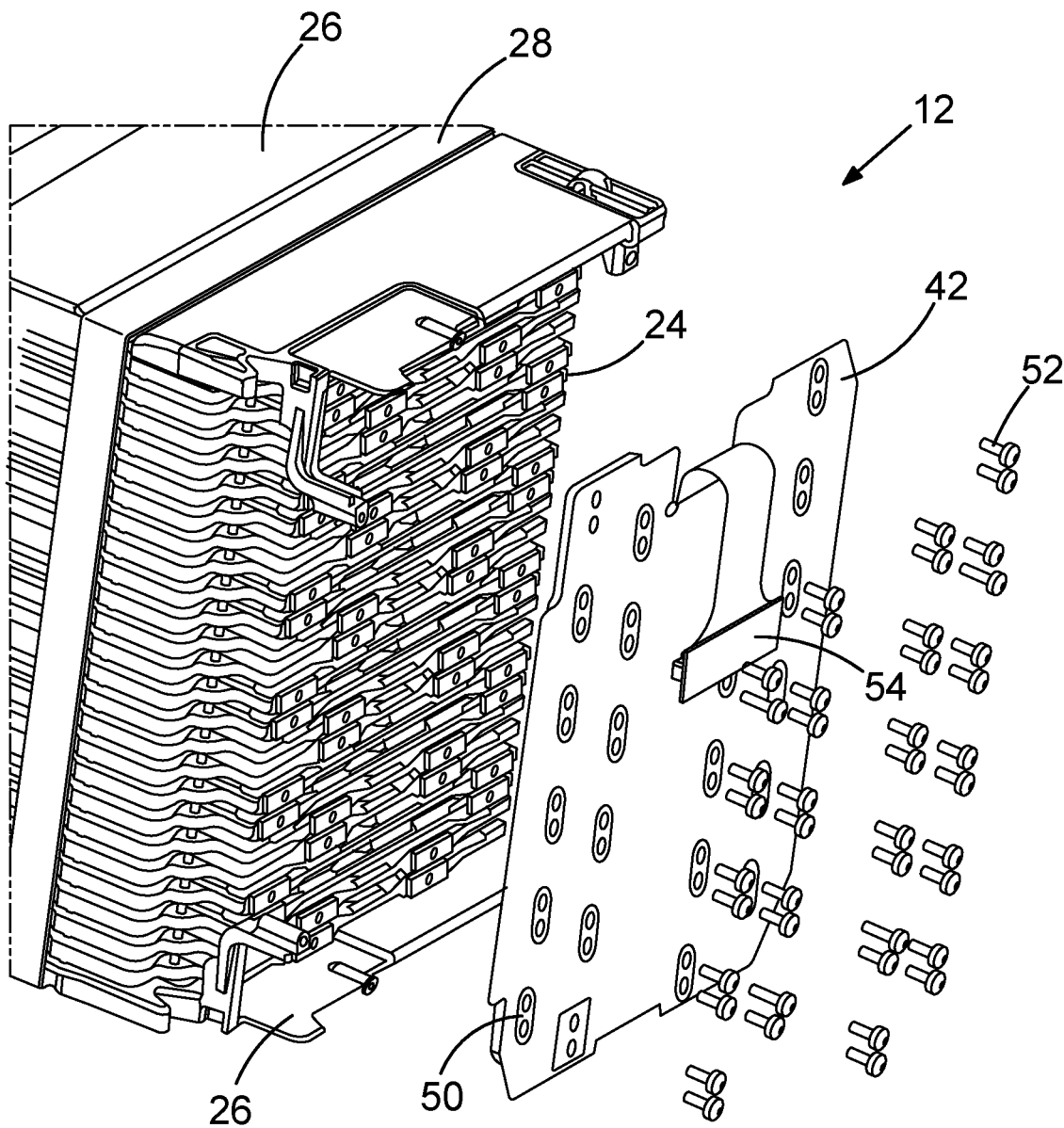
FIG. 4 shows how the cells in a battery module are connected using a laminated busbar.

FIG. 4 shows how the cells in the battery module are connected using the laminated busbar. Referring to FIG. 4, the laminated busbar includes a plurality of metal bars 50 held between plastic sheets. The laminated busbar 42 is connected to the cells 24 by means of electrically conducting pins 52. The pins pass through holes in the metal bars 50, and into corresponding holes in the terminal blocks of the cells 24. The ends of the pins 52 are threaded and engage with threads in the holes in the terminal blocks. The metal bars 50 are arranged to connect adjacent battery cells in the appropriate series and parallel configuration. A connector 54 is provided for connecting the laminated busbar 42 to the battery management unit 46.

Figure 5:
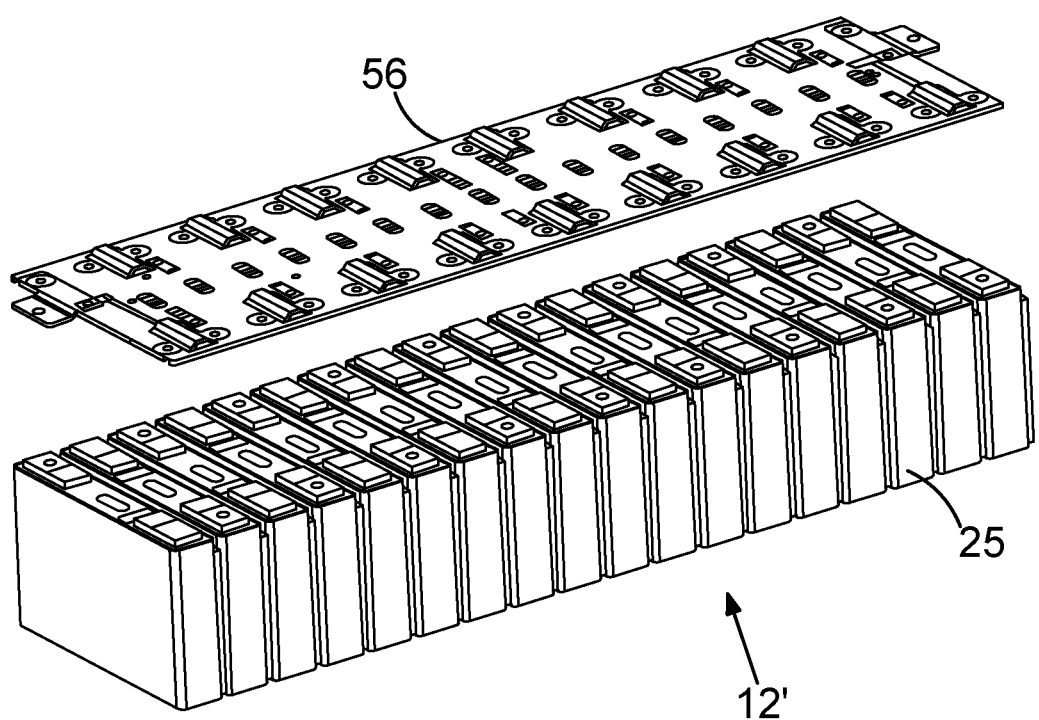
FIG. 5 shows an alternative battery module comprising a plurality of prismatic cells.

FIG. 5 shows an alternative battery module comprising a plurality of prismatic cells. Referring to FIG. 5, the battery module 12' in this example comprises eighteen prismatic cells 25 stacked together side by side. A laminated busbar 56 is used to connect the battery cells in series and/or parallel to achieve the target pack voltage. A battery management unit (not shown in FIG. 5) is connected to the laminated busbar and used to monitor and manage cell charge and other aspects of cell operation.

Figure 6A:
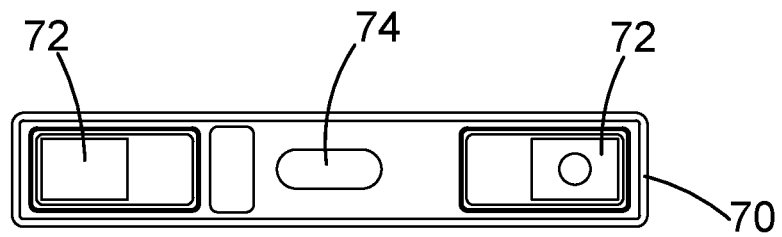
FIGS. 6A and 6B show parts of a prismatic cell.
Figure 6B:
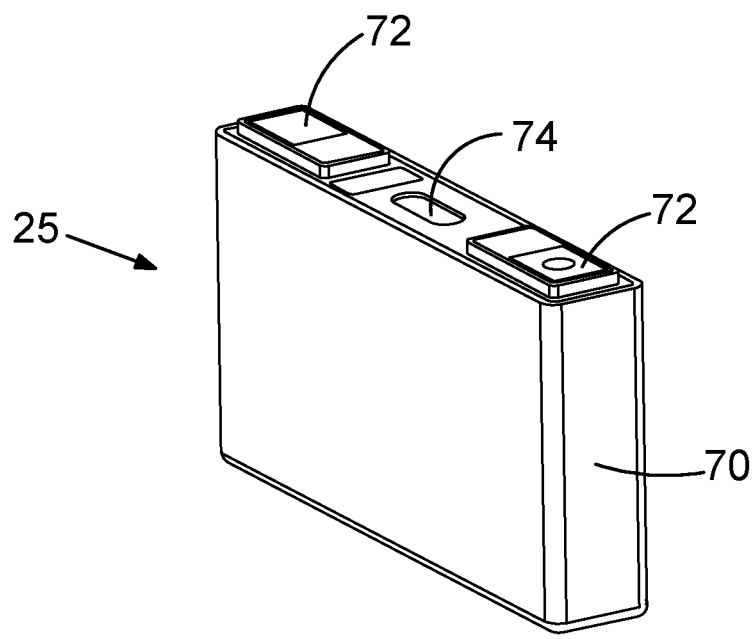

FIGS. 6A and 6B show in more detail parts of one of the prismatic cells. A top view of the cell is shown in FIG. 6A and a perspective view is shown in FIG. 6B. The cell comprises a metal case 70 and electrical terminal blocks 72. A pressure relief vent 74 is provided at the top of the cell. The vent 74 is designed to open when the pressure inside the cell exceeds a certain level, in order to vent gases produced during thermal runaway.

In the arrangements described above, the battery cells are typically lithium-ion cells held in a pouch or a metal case. Compared with other types of rechargeable battery cell, lithium-ion cells have a high specific capacity, energy density and power density. These advantages make lithium-ion cells suitable for long-term operation and high-current usage in applications such as electric vehicles. However, if a lithium-ion cell is short-circuited or exposed to high temperature, exothermic reactions can be triggered. This may result in the cell overheating or catching fire. The close proximity of the individual cells means that if one cell catches fire, the fire can easily spread through the module. Furthermore, due to the close proximity of the modules in the battery pack, the fire can potentially spread to other modules, leading to a thermal runaway event throughout the battery pack. If the battery pack is being used in a vehicle, this may lead to safety concerns for the vehicle occupants.

It would therefore be desirable to provide a monitoring system which can provide an early warning of a thermal runaway event.

Previous attempts at detecting thermal runaway events have involved providing the battery management unit with one or more temperature sensors which can detect rises in temperature. However, in such arrangements, the cell which initially fails may be located at a distance from the temperature sensor. Therefore, the thermal runaway event may already be underway before a corresponding rise in temperature is detected. On the other hand, if each cell were provided with a temperature sensor, this would increase the size, cost and complexity of the battery pack, which are important considerations in the automotive space.

In embodiments of the disclosure, a single sensing circuit is used to sense a plurality of cells in a battery module, in order to provide an indication of an imminent thermal runaway event.

Figure 7:
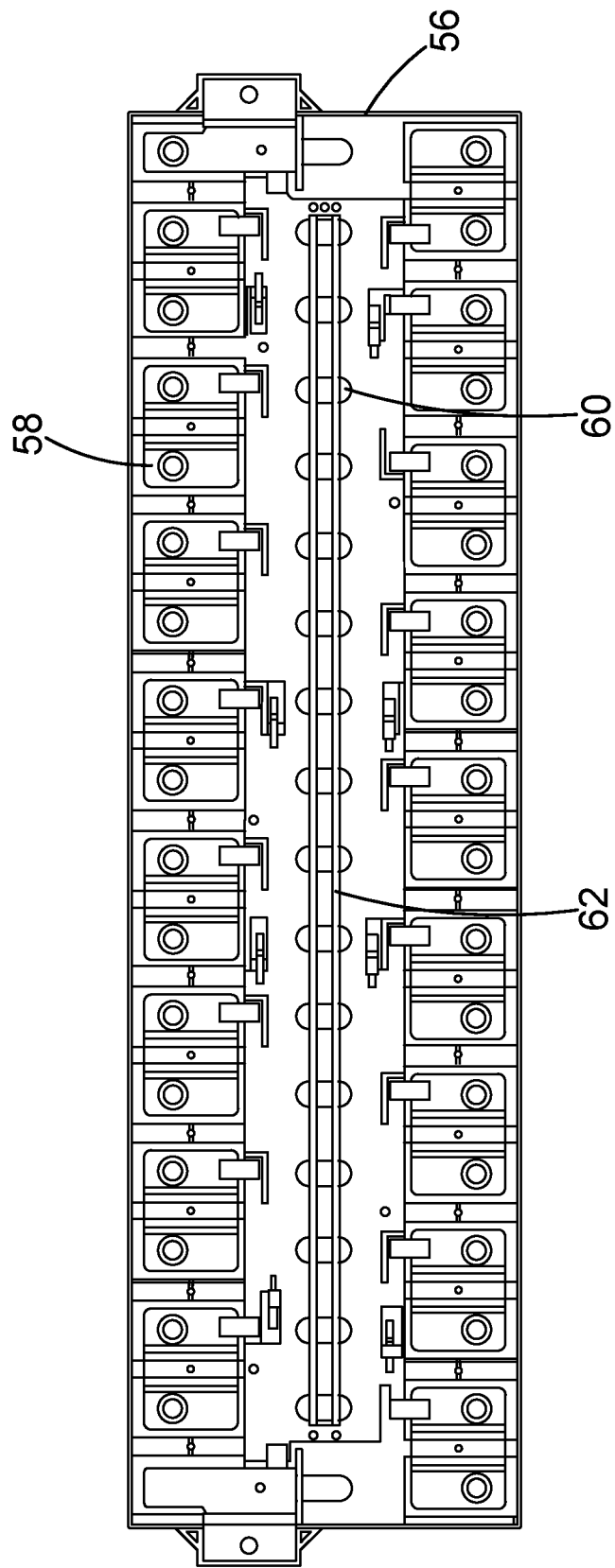
FIG. 7 shows parts of a laminated busbar in an embodiment of the disclosure.

FIG. 7 shows parts of a laminated busbar in an embodiment of the disclosure. Referring to FIG. 7, the laminated busbar 56 comprises a plurality of metal bars 58 held between plastic sheets. In this embodiment, the metal bars 58 are arranged to connect eighteen prismatic cells in a series configuration.

In the arrangement of FIG. 7, the laminated busbar 56 includes a plurality of vent holes 60. Each vent hole 60 is located above a corresponding battery cell. The positions of the holes are chosen so that they are directly above a vent 74 in the battery cell. This provides a path for venting gases to escape.

Also shown in FIG. 7 is a trace circuit 62. The trace circuit 62 is a thin strip of metal (such as copper) on a flexible printed circuit board which is one of the layers of (or is attached to) the laminated busbar 56. The trace circuit 62 runs from one end of the laminated busbar 56 to the other end, then loops around and runs back to the first end. On both the outward and return paths the trace circuit 62 crosses the holes 60 in the laminated busbar. The holes 60 also run through the printed circuit board on which the trace is formed. Thus, where the trace 62 crosses a hole 60, it is exposed to the vent 74 at the top of the corresponding battery cell. The ends of the trace circuit 62 are connected to the battery management unit.

Figure 8:
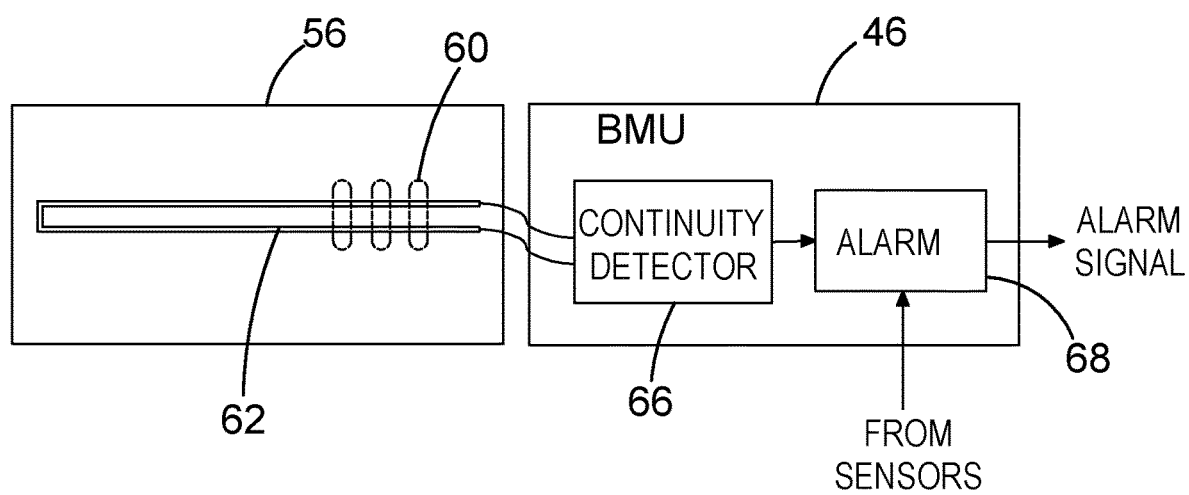
FIG. 8 shows parts of a monitoring system in an embodiment of the disclosure.

FIG. 8 shows parts of a monitoring system which includes the laminated busbar of FIG. 7. Referring to FIG. 8, the monitoring system comprises laminated busbar 56 and battery management unit (BMU) 46. The laminated busbar 56 comprises holes 60 and trace circuit 62 as described above. The battery management unit 46 comprises continuity detector 66 and alarm signal generator 68. The ends of the trace circuit 62 are connected to the continuity detector 66. The output of the continuity detector 66 is connected to the alarm signal generator 68. The output of the alarm signal generator is an alarm signal which may be sent to the battery management system 16.

In operation, thermal runaway of a battery cell may be triggered, for example, if the cell has defects that lead to short-circuiting, if it is overheated, if it is subject to excessive power usage, or it is punctured. During thermal runaway, the electrolyte reacts with the electrode and releases flammable hydrocarbon gases. In a pouch cell, the release of gases will force open the pouch at its weakest point, which is usually the top of the cell where the electrodes are located. In a prismatic cell, a vent is usually provided at the top of the cell for the release of gases in the case of thermal runaway. Thus, during thermal runaway, hot, flammable gasses are typically expelled from the top of the cell.

In the arrangement of FIGS. 7 and 8, the trace circuit 62 is arranged such that it passes directly within the projected path of the gases expelled from the cells in the case of thermal runaway. The thickness of the trace 62 is chosen such that, when an individual cell vents, the metal will be severed by the venting action. This may take place because of the temperature of the vented constituents, or the momentum and subsequent force of the vented components exerted on the trace, or the chemical nature of the trace and the vented constituents, or some combination thereof. A suitable thickness for the trace 62 may be between 0.0005 and 0.1 inches (0.0127 to 2.54 mm), although other values could be used instead.

With reference to FIG. 8, the continuity detector 66 is used to sense the continuity of the trace circuit 62. This may be done, for example, by applying a voltage to the trace circuit (via a series resistor) and detecting whether there is any current flow. If the trace 62 has been severed by the venting action of one or more of the battery cells, then the continuity detector 66 will detect a lack of continuity in the trace circuit. In that case, the continuity detector outputs a signal to the alarm signal generator 68 indicating that the trace has severed. The alarm signal generator generates an alarm signal when the signal from the continuity detector 66 indicates that the trace 62 has severed. The output of the alarm signal generator 68 is sent to the battery management system 16. In response thereto, the battery management system can trigger an alarm which can warn the vehicle occupants (for example, the driver and/or passengers) of a thermal runaway event and allow the vehicle to be safely evacuated.

Optionally, the alarm signal generator 68 may also receive an output from one or more other sensors, such as a pressure and/or temperature sensor. This can allow the alarm signal generator to produce an alarm signal based on a number of different sensed parameters, which may help to improve the speed and reliability of detection of a thermal runaway event.

Figure 9:
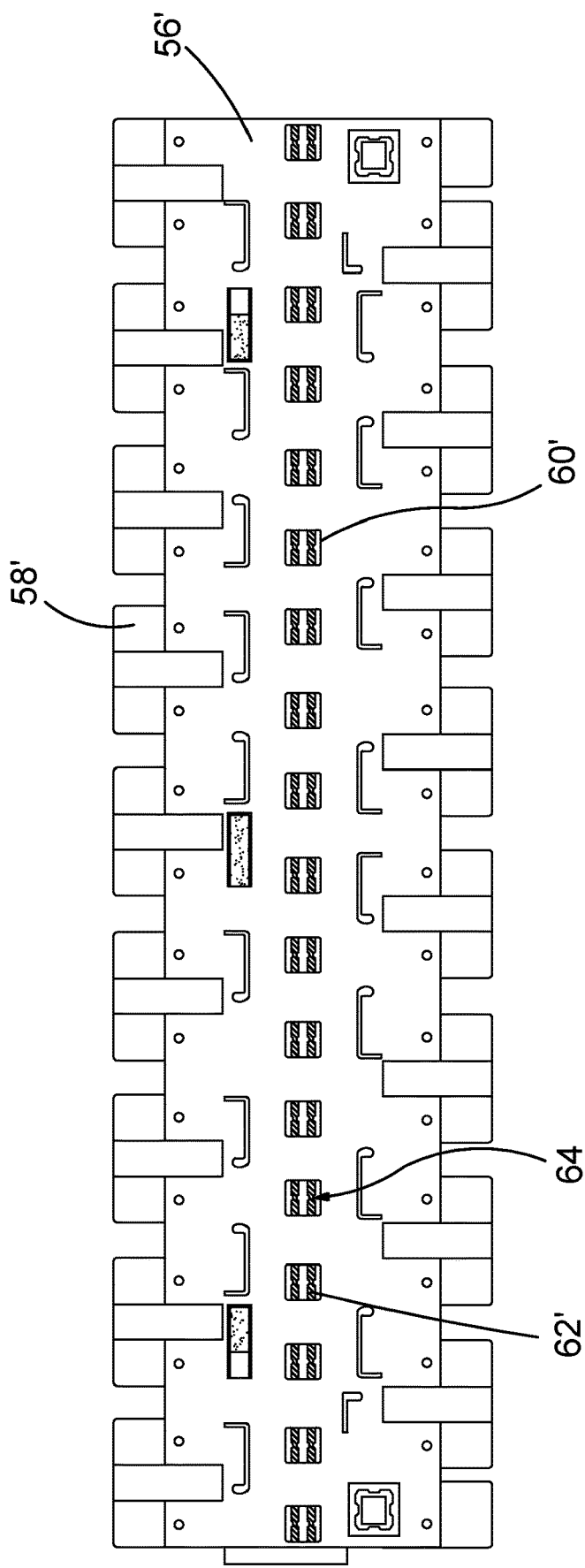
FIG. 9 shows parts of a laminated busbar in another embodiment of the disclosure.

FIG. 9 shows parts of a laminated busbar in another embodiment of the disclosure. Referring to FIG. 9, the laminated busbar 56' comprises a plurality of metal bars 58', a plurality of vent holes 60', and a trace circuit 62'. The metal bars 58', vent holes 60', and trace circuit 62' function in a similar way to the corresponding parts described above with reference to FIG. 7. However, in the arrangement of FIG. 9, the trace circuit 62' includes a plurality of notches 64. The notches 64 are provided in the areas where the trace circuit crosses a hole 60'. The notches 64 are indentations in the trace circuit, which cause the trace circuit to have a reduced cross section, and thus a reduced strength. The notches 64 act as a stress concentration feature to help the trance circuit break when a cell vents.

Figure 10:
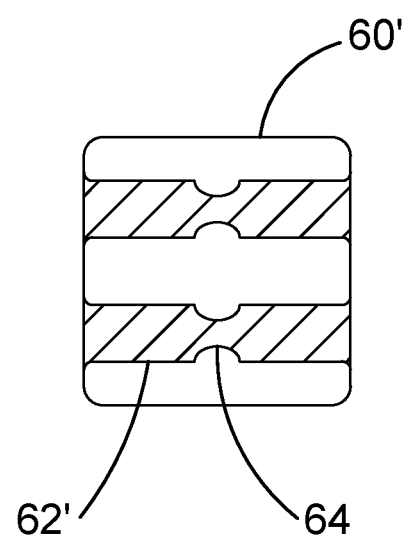
FIG. 10 shows part of the laminated busbar of FIG. 9 in more detail.

FIG. 10 shows in more detail one of the vent holes 60' in the arrangement of FIG. 9. Referring to FIG. 10, it can be seen that the notches 64 in the trace circuit 62' are in the form of indentations on either side of the trace. The indentations can be formed by etching of the copper trace during manufacture. The indentations are sized so as to increase the likelihood of the trace circuit severing when a cell vents, while minimizing the risk of accidental breakage, for example due to mechanical shocks.

Other types of stress concentration feature could be provided instead of or as well as the notches shown in FIGS. 9 and 10. For example, holes could be provided in the trace, or the trace could taper inwards at the appropriate locations.

If desired, two or more trace circuits of the type shown in FIGS. 7 to 9 could be provided on the laminated busbar 56. In this case, each trace circuit may cross some or all of the vent holes 60 in the laminated busbar. Each trace circuit may be monitored for continuity.

Figure 11:
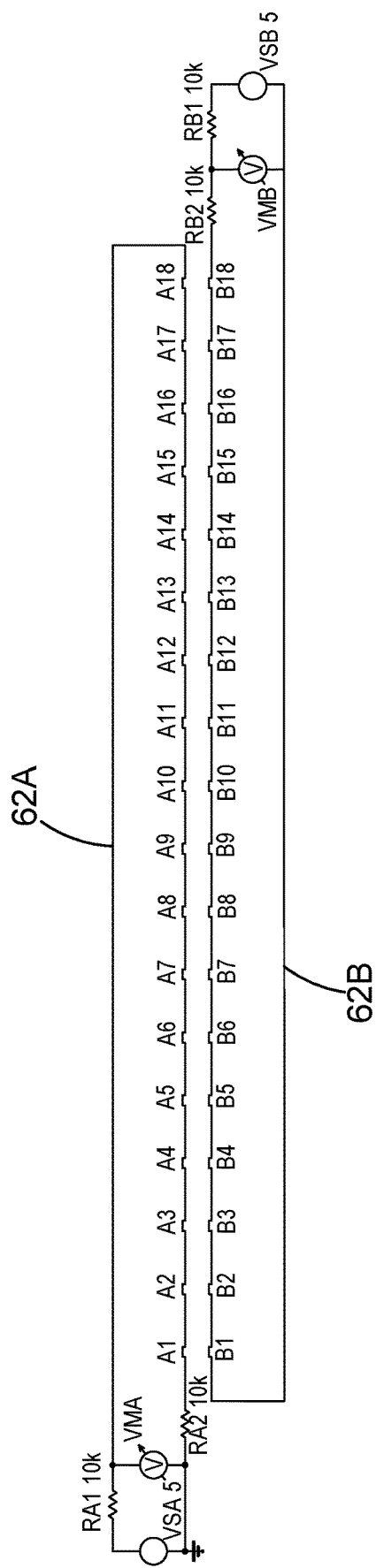
FIG. 11 is a circuit diagram of a monitoring system in one embodiment.

FIG. 11 is a circuit diagram of a monitoring system using two trace circuits. Referring to FIG. 11, the monitoring system in this example comprises a first trace circuit 62A and a second trace circuit 62B. Each trace circuit 62A, 62B is a continuous loop which runs from one end of the laminated busbar 56 to the other, and then back to the first. One of the legs of the trace circuit 62A crosses the vent holes 60 in the laminated busbar in the locations indicated by A1-A18. Similarly, one of the legs of the trace circuit 62B crosses the vent holes 60 in the locations indicated by B1-B18. Both trace circuits 62A, 62B are connected to a respective monitoring circuit.

In this example, each monitoring circuit comprises a voltage source VSA, VSB, a first resistor RA1, RB1, a second resistor RA2, RB2, and a voltage monitor VMA, VMB. The resistor RA1, trace circuit 62A and resistor RA2 are connected in series. Similarly, the resistor RB1, trace circuit 62B and resistor RB2 are connected in series.

In operation, the voltage source VSA applies a predetermined voltage (in this example, 5V) to the series connection of resistor RA1, trace circuit 62A and resistor RA2. The voltage monitor VMA monitors the voltage across trace circuit 62A and resistor RA2. Similarly, the voltage source VSB applies a predetermined voltage to the series connection of resistor RB1, trace circuit 62B and resistor RB2, and the voltage monitor VMB monitors the voltage across trace circuit 62B and resistor RB2.

Figure 12:
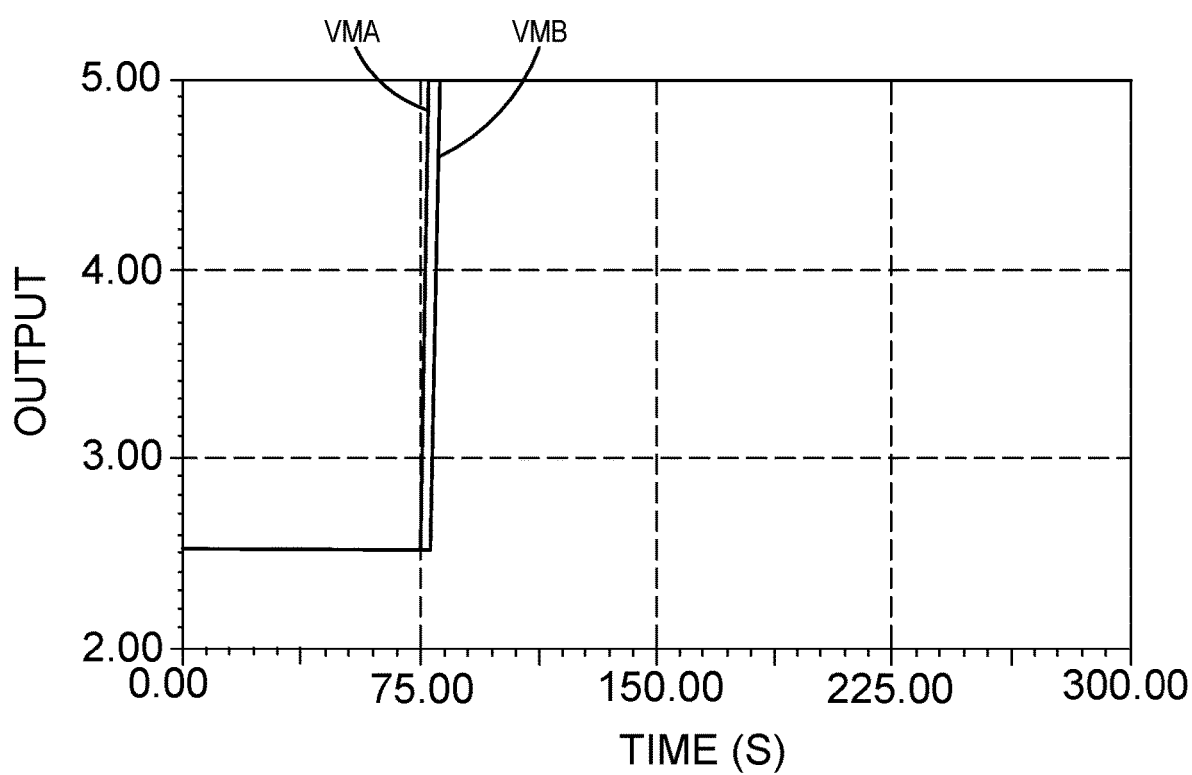
FIG. 12 shows an example of voltages seen by the voltage monitors of FIG. 11.

FIG. 12 shows an example of the voltages which would be seen by the voltage monitors VMA and VMB if one of the battery cells vented, causing one of the traces to sever. In this example, it is assumed that one of the cells opens trace 62A at time 75s and trace 62B at time 80s. In this case, voltage monitor VMA will see an increase in voltage to 5V (the voltage applied by the voltage source VSA) at time 75s, and voltage monitor VMA will see an increase in voltage to 5V at time 80s. The outputs of the voltage monitors VMA, VMB can be used to provide an indication of a thermal runaway event, by comparing the measured voltages to a threshold.

In the example above, the two trace circuits can be used to provide an indication of a thermal runaway event as early as possible, by detecting when the first one of the two trace circuits has severed. Alternatively, some protection against false positives can be provided by detecting when both trace circuits have severed.

In the embodiments described above, the trace circuit can be provided as part of a flexible circuit board which is attached to or part of the laminated busbar. Typically, such a flexible circuit board is already present as part of the laminated busbar, for example in order to bring voltage measurements to the battery management unit. Thus, the trace circuit can be provided at minimal additional cost and without increasing the size of the battery module. Furthermore, the battery management unit is only required to monitor the status of one component, namely, the trace circuit. These embodiments can therefore allow an indication of an imminent thermal runaway event to be provided without adding significantly to the size, cost and complexity of the battery module.

In an alternative arrangement, rather than using a trace circuit which is part of a circuit board, a separate electrically conductive wire could be run across the tops of the cells as the locations where venting gasses are likely to be expelled in the event of thermal runaway. In this case, the continuity of the electrically conductive wire could be monitored. In another alternative, an optical fibre could be used instead, and the presence or absence of light transmitted through the optical fibre could be detected.

In a further alternative arrangement, rather than determining whether or not current is flowing through the trace circuit, the system could be arranged to determine the amount of current flow through and/or the resistance of the trace circuit.

When hot gases vent from one of the battery cells, the part of the trace circuit that is in the path of the gases will heat up. Since the trace is formed from metal, its resistance will increase as its temperature increases. Thus, when hot gases vent, the resistance of the metal trace will increase. Furthermore, during thermal runaway, the battery cell will normally heat up before any gases are vented. This may also lead to an increase in the temperature of the metal trace, and thus to an increase in its resistance. Thus, by detecting a drop in current through the trace circuit or an increase in resistance of the trace circuit, it may be possible to detect an imminent thermal runaway event before the metal trace has severed.

A potential disadvantage of the above embodiments is that they may rely on a battery cell venting or at the very least reaching a high temperature before a thermal runaway event can be detected. However, in some circumstances, it may be desirable to provide an early indication of an imminent thermal runaway event before a battery cell has started venting. This may for example provide additional time for the vehicle to be evacuated before the thermal runaway event spreads through the entire battery pack.

Figure 13:
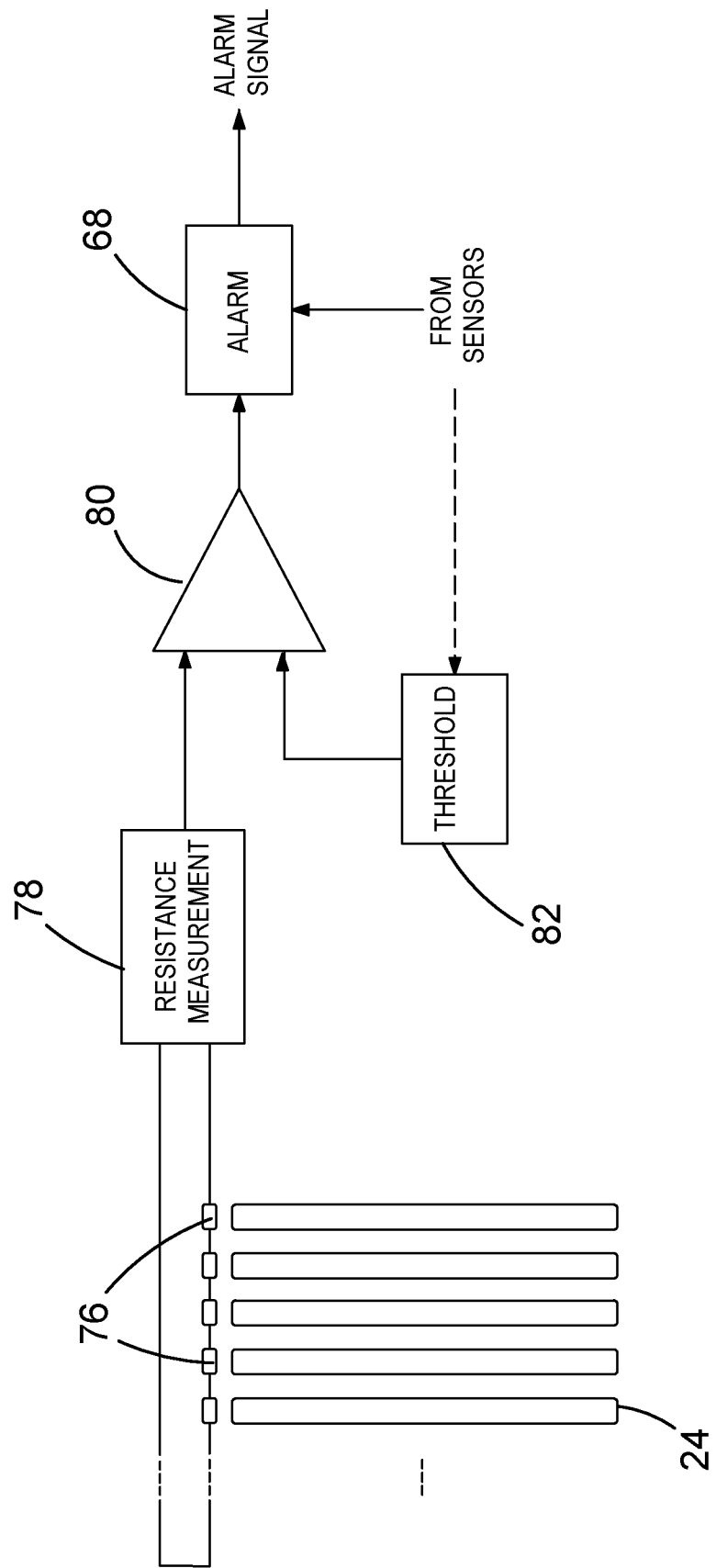
FIG. 13 shows parts of a monitoring system in another embodiment.

FIG. 13 shows parts of a monitoring system in another embodiment. Referring to FIG. 13, the monitoring system comprises a plurality of thermistors 76, a resistance measuring unit 78, comparator 80, threshold generator 82 and alarm signal generator 68. Each of the thermistors 76 is in thermal contact with or in the vicinity of one of the battery cells 24 in a battery module. The battery cells may be any type of battery cell, such as prismatic, pouch or cylindrical. The thermistors 76 are connected in series to form a chain of thermistors. The chain of thermistors is connected at each end to the resistance measuring unit 78. The output of the resistance measurement unit 78 is connected to an input of the comparator 80. The comparator also receives an input from the threshold generator 82. The output of the comparator 80 is connected to the alarm signal generator 68.

The resistance measuring unit 78, comparator 80, threshold generator 82 and alarm signal generator 68 can be composed of discrete hardware. Alternatively, some or all of these components could be implemented using an analog-to-digital converter within a microprocessor incorporating associated software logic to carry out the functions shown in the diagram. If desired, some or all of these components could be part of the battery management unit.

In this embodiment, the thermistors 76 are positive temperature coefficient (PTC) thermistors. Such devices have a resistance which increases with temperature.

Since the thermistors are connected in series, the total resistance of the chain of thermistors is the sum of the resistance of each individual thermistor.

In operation, if a battery cell has a defect that will lead to a thermal runaway event, then it will first start to heat up. This will normally happen before the cell starts to vent. The heat of the cell will then transfer to the associated PTC thermistor in the chain of thermistors. As the thermistor heats up, its resistance increases. This will cause the total resistance of the chain of resistors to increase.

In the arrangement of FIG. 13, the total resistance of the chain of thermistors is measured by the resistance measurement unit 78. This may be achieved, for example, by passing a constant current through the chain of thermistors and measuring the voltage across the chain. Alternatively, a constant voltage may be applied and the resulting current measured. In either case, the resistance may be determined using Ohm's Law. It will be appreciated that other techniques for measuring the resistance could be used instead.

The total resistance of the chain as measured by the resistance measurement unit 78 is fed to one input of the comparator 80. The comparator 80 also receives a threshold value from the threshold generator 82. When the total resistance of the chain of thermistors exceeds the threshold value, the comparator 80 outputs a signal to the alarm signal generator 68. The alarm signal generator 68 generates an alarm signal in response thereto. As in the previous embodiments, the alarm signal generator 68 may also receive an output from one or more other sensors. The output of the alarm signal generator is sent to the battery management system 16, which can trigger the appropriate alarm.

The threshold value set by the threshold generator 82 is chosen to be higher than the normal operating temperature of the battery pack, but low enough to provide an indication of an imminent thermal runaway event as quickly as possible. The threshold value may be fixed or variable. For example, the threshold generator may receive other inputs, such a signal indicating ambient temperature and/or an amount of current being supplied to or from the battery pack, and adjust the value of the threshold accordingly.

Alternatively, rather than detecting when the resistance of the chain of thermistors exceeds a threshold value, it would be possible to monitor the rate of change of the resistance, or some other time derivative thereof. In this case, the alarm signal generator 68 may produce an alarm signal in the event that the time derivative of the resistance exceeds a threshold. Since heating of a cell due to thermal runaway tends to occur more quickly than other temperature changes (for example, due to changes in ambient temperature), this may help to avoid false positives.

In one embodiment, the PTC thermistors are surface mount devices which are mounted on a flexible circuit board. The flexible circuit board may be located on the underside of the laminated busbar 56 (i.e. the side that faces the battery cells). Some electrically insulative/thermally conductive gap-pad material may be provided between each thermistor and its associated cell, to increase the thermal contact between the two.

In another embodiment, the PTC thermistors are discrete components mounted on a flexible circuit board. In this case, the thermistors may be either in direct contact with the battery cells, or connected to them via a thermally conductive (and electrically insulative) material.

Figure 14:
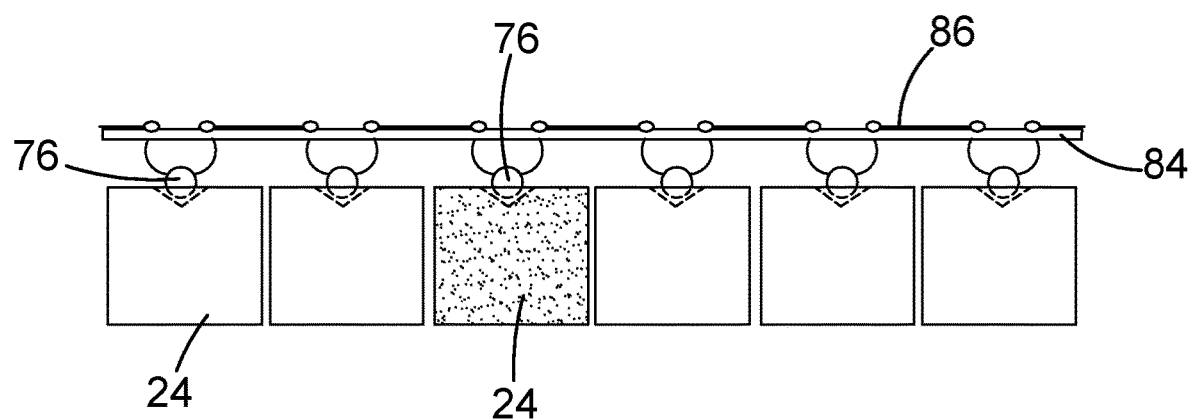
FIG. 14 illustrates how a plurality of discrete thermistors may be connected to battery cells.

FIG. 14 illustrates how a plurality of discrete thermistors may be connected to the battery cells. Referring to FIG. 14, each thermistor 76 is mounted on the underside of a circuit board 84. The circuit board is a flexible circuit board which is located on the underside of the laminated busbar 56. The leads of the thermistors 76 pass through holes in the circuit board 84. The thermistors 76 are connected in series using metal traces 86 on the upper side of the circuit board 84. In this example, each thermistor 76 is in direct contact with an associated battery cell 24. Thus, should one of the battery cells start to heat up, this will increase the resistance of the corresponding thermistor, and thus the total resistance of the chain of thermistors.

In the arrangement described above, a rise in the temperature of a battery cell can be detected before the battery cell starts to vent, which may help to provide a more predictive indication of a thermal runaway event. On the other hand, should the battery cell vent, then this will rapidly increase the temperature of the associated thermistor and/or disconnect or destroy the thermistor. In either case, this will be seen as an increase in the total resistance of the chain of thermistors, potentially to open circuit. Thus, the monitoring system will also produce an alarm signal in the event that a battery cell starts to vent.

Figure 15:
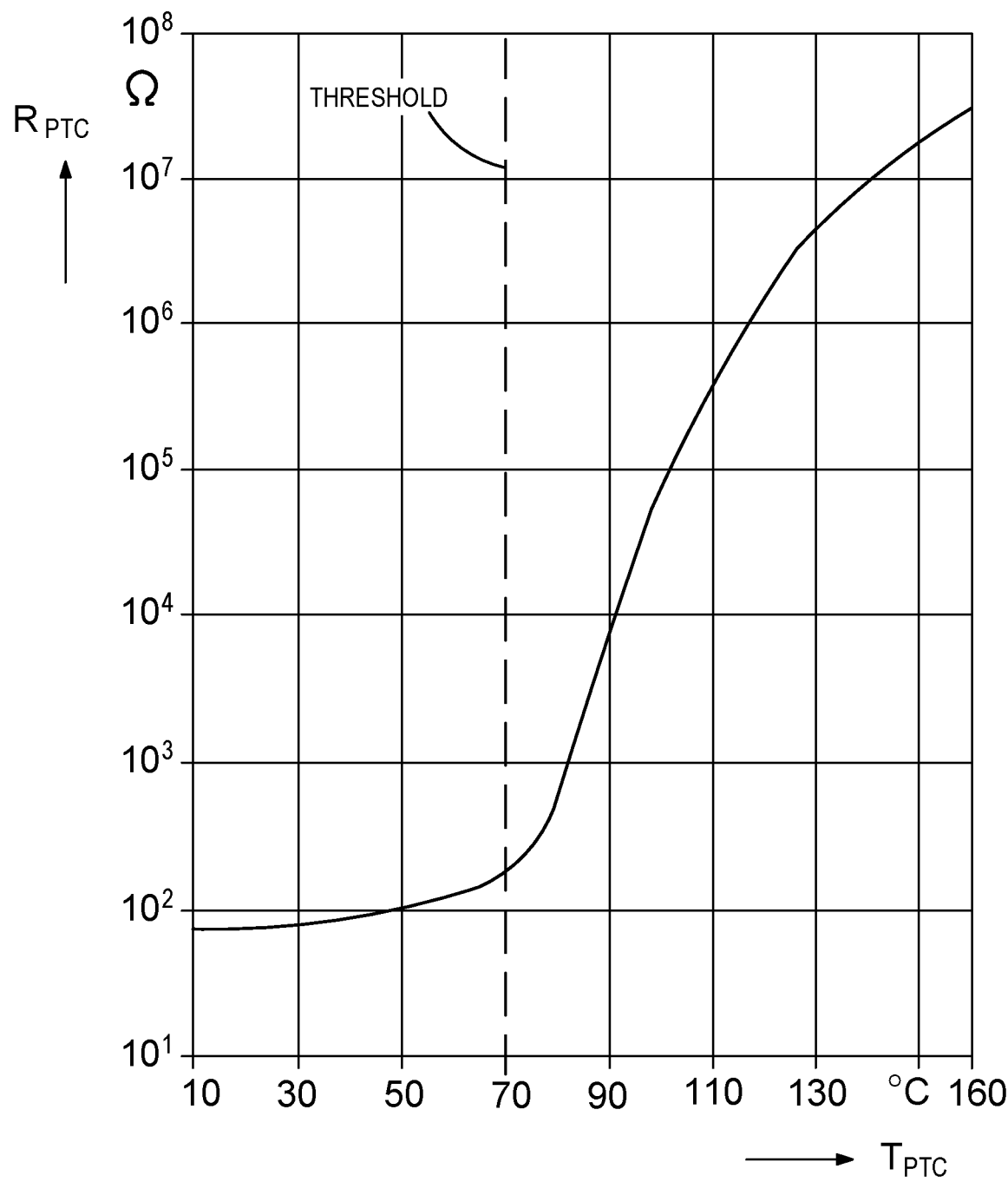
FIG. 15 shows resistance against temperature of an example PTC device.

The PTC thermistors used in the embodiments described above are preferably non-linear devices, in which the resistance increases non-linearly with temperature. FIG. 15 shows resistance against temperature of an example PTC device. In this example, the cell thermal runaway threshold is set at 70° C., although of course other values may be used instead.

Referring to FIG. 15, it can be seen that the device in this example has a temperature dependency as shown in the following table.

| Temperature | Resistance |
| --- | --- |
| 25-55° C. | 100Ω |
| 70° C. | 200Ω |
| 80° C. | 500Ω |
| 90° C. | 8kΩ |
| 100° C. | 80kΩ |

Thus, where there are 18 cells each with an associated PTC thermistor, then between 25° C. and 55° C. the total resistance of the chain will be 18×100Ω=1.8 kΩ. However, if the temperature of one of the thermistors increases to 70° C., then the total resistance will increase to 1.9 kΩ. When the temperature reaches 80° C. the total resistance will be 2.2 kΩ, when it reaches 90° C. the total resistance will be 9.7 kΩ and when it reaches 100° C. the total resistance will be 82 kΩ. This rapid change in resistance with temperature can be easily detected, allowing an increase in temperature of one of the cells to be detected without having to monitor all of the cells separately. For instance, in this example, the threshold may be set at around 1.9 kΩ, corresponding to a temperature of 70° C.

Figure 16:
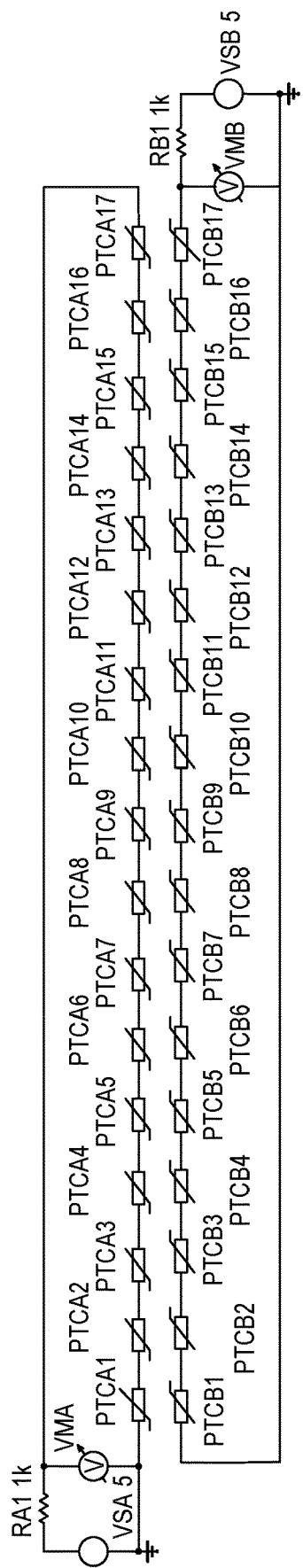
FIG. 16 is a circuit diagram of a monitoring system using two thermistor circuits.

FIG. 16 is a circuit diagram of a monitoring system using two thermistor circuits. Referring to FIG. 16, in this example the monitoring system comprises a first chain of PTC thermistors PTCA1-PTCA17 and a second chain of PTC thermistors PTCB1-PTCB17. A thermistor from each chain is located above one of the vent holes 60 in the laminated busbar. Both chains of thermistors are connected to a respective monitoring circuit. Each monitoring circuit comprises a voltage source VSA, VSB, a resistor RA1, RB1 and a voltage monitor VMA, VMB. The resistor RA1 and thermistors PTCA1-PTCA17 are connected in series. Similarly, the resistor RB1 and thermistors PTCB1-PTCB17 are connected in series.

In operation, the voltage source VSA applies a predetermined voltage (in this example, 5V) to the series connection of resistor RA1 and thermistors PTCA1-PTCA17. The voltage monitor VMA monitors the voltage across the series connection of thermistors PTCA1-PTCA17. Similarly, the voltage source VSB applies a predetermined voltage to the series connection of resistor RB1 and thermistors PTCB1-PTCB17, and the voltage monitor VMB monitors the voltage across thermistors PTCB1-PTCB17.

Figure 17:
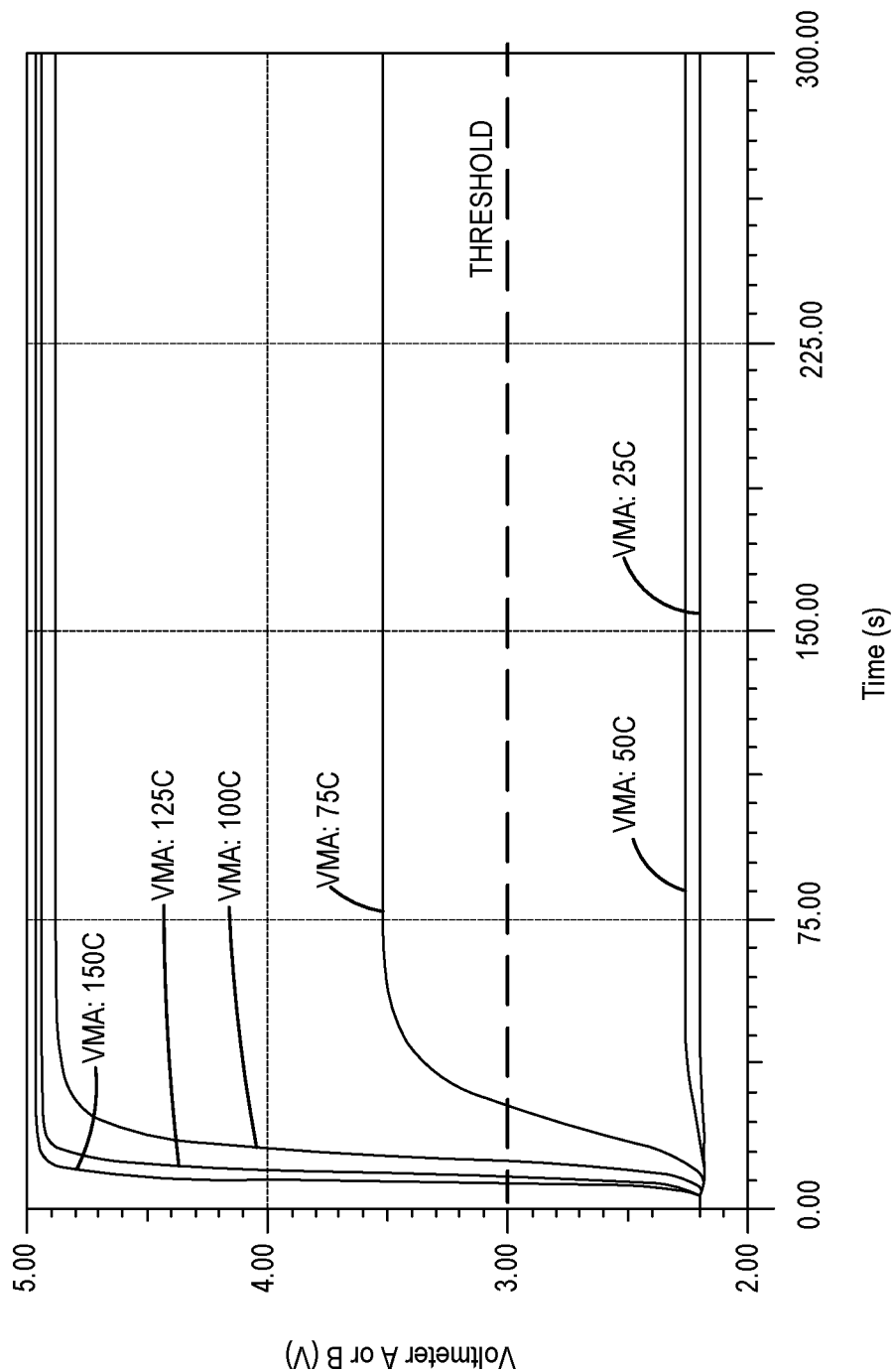
FIG. 17 shows examples of the voltages which would be seen by the voltage monitors of FIG. 16.

FIG. 17 shows examples of the voltages which would be seen by the voltage monitors VMA and VMB for various different temperatures of one of the thermistors in the chain. In this example, it is assumed that the cell thermal runaway detection threshold is set at 3V, corresponding to a temperature of approximately 70° C. It is assumed that one of the thermistors starts to heat due a thermal runaway event, while the other thermistors in the chain remain at a temperature of 25° C. Referring to FIG. 15, it can be seen that the voltage seen by the voltage monitor VMA, VMB will increase rapidly above the threshold as the temperature of the thermistor increases. The outputs of the voltage monitors VMA, VMB can thus be used to provide an indication of a thermal runaway event, by comparing the measured voltages to the threshold.

In the example above, the two thermistor circuits can be used to provide an indication of a thermal runaway event as early as possible, by detecting when the resistance of one of the two circuits crosses the threshold. Alternatively, some protection against false positives can be provided by detecting when the resistances of both circuits cross the threshold. If desired, different thresholds could be set depending on whether it is the first or the second circuit to cross the threshold.

By using a chain of thermistors in the way described above, it may be possible to detect when a battery cell first starts to heat up above normal operating temperature, before the cell starts to vent. Since the PTC thermistors are non-linear, this can be done with a much greater degree of accuracy than using a trace circuit. Furthermore, this can be achieved by monitoring a single parameter, namely, the total resistance of the chain of thermistors. The thermistors may be provided on an existing circuit board, without adding significantly to the size or cost. Thus, an early indication of an imminent thermal runaway event may be provided without adding significantly to the size, cost and complexity of the battery module.

Rather than associating a thermistor with each battery cell, it would be possible to associate a thermistor with two or more battery cells. For example, a thermistor could be located between two adjacent battery cells. It would also be possible to have some cells without an associated thermistor. On the other hand, it would also be possible to associate two or more thermistors with each battery cell, either for redundancy or to monitor a different part of the cell. For example, since the thermistors are connected in a chain, it would be possible for the thermistors to be located on both the outward leg and the return leg, with two thermistors per cell or pair of cells. In general, any number of thermistors may be provided with any number of battery cells.

If desired, it would be possible to provide synergistic cell and sensor arrangements with cell vent holes pointed at a common location. For example, the thermistors and cell vent holes could be arranged such that a plurality of cell vent holes are directed to a single location. In this case, one thermistor may be capable of monitoring a plurality of cells.

As an alternative to non-linear positive temperature coefficient (PTC) thermistors, it would be possible to use devices with a substantially linear response, or with a non-linear response that differs from that of a PTC thermistor. For example, a sensing circuit which has a linear response or at least some response throughout all modes of operation may be used to train a machine learning algorithm. Such an algorithm may also receive inputs of various types from throughout the battery pack. This may allow various temperature abnormalities within the pack which may be indicative of an imminent or likely thermal runaway event to be detected.

For example, as an alternative to PTC thermistors, it would also be possible to use a chain of negative temperature coefficient (NTC) thermistors connected in series, with each thermistor associated with a battery cell. In this case, the comparator 80 would be arranged to determine when the resistance dropped below a threshold. However, such an arrangement may be less accurate, and would not in itself indicate if the chain was broken.

In another embodiment, rather than using sensors connected in series, it would be possible for at least some of the sensors to be connected in parallel. For example, a typical NTC thermistor has a resistance of around 10 kΩ at 25° C. and a resistance of around 1 kΩ at 100° C. For such devices it may be preferable to arrange them at least partially in parallel.

In another embodiment, rather than using a chain of thermistors, a plurality of thermocouples connected in series could be used instead. In this case, the chain would consist of alternating types of thermocouple wire where the wire type would switch from one type to another. Each thermocouple junction may be associated with one or more battery cells, for example, at every vent hole. For a four-junction setup the approximate voltage output of the chain of thermocouples would be given by the expression:

$$\Delta V = (S_1 - S_2) \cdot (T_{j1} - T_{j2} - T_{j3} - T_{j4})$$

Where $S_1$ and $S_2$ are the Seebeck coefficients of the first and second materials, and $T_{j1}$ to $T_{j4}$ are the temperatures at the thermocouple junctions. Thus, by monitoring the voltage of the chain of thermocouples, it is possible to determine if there are any significant temperature differences inside the battery module. Since a thermal runaway event will normally start with the failure of a single cell, this arrangement may also be used to provide an early indication of a imminent thermal runaway event.

For example, if a BMS receiving an input from a series of thermocouples were to perceive a condition in which the battery pack by and large seems to be in an at rest state at 25° C. while the series of thermocouples indicates a rapid temperature increase somewhere within the circuit to, say, 40° C., this by itself could be a sign of alarm. In this case the rapid nature of the temperature change may rule out the possibility of it being related to a large-scale temperature change.

In general, in any of the embodiments disclosed herein, a rate of change, or any other time derivative, of the parameter being monitored may be used to detect an imminent or likely thermal runaway event. For example, if a chain of NTC thermistors were connected in series, monitoring the time derivative may be desirable due to the characteristics of the devices. This may also help to mitigate the effects of a broken chain. For example, if the "chain breaking" was preceded by a rapid decrease in resistance that may indicate a thermal run away.

In further embodiments, other temperature sensing devices could be used as well as or instead of any of the devices described above. For example, a chain of resistance temperature detectors (RTDs) or a chain of infrared thermometers could be used instead of the thermistors or thermocouples described above.

The various embodiments described above may also be used in combination. For example, a temperature sensing device such as a PTC thermistor could be connected across a vent hole in the circuit board in such a way that it will respond to an increase in temperature of the associated cell, and it will sever from the circuit board if the cell should vent. For example, the device could be connected with a severable metal trace. In this way, the system can respond to both an increase in temperature of the cell and venting of the cell. Any other combination of the above embodiments may be used as well or instead.

It will be appreciated that embodiments of the present disclosure have been described above by way of example only, and modifications in detail will be apparent to the skilled person within the scope of the appended claims.

What is claimed is:

1. A battery module comprising:
   a plurality of battery cells;
   a sensing circuit extending across the plurality of battery cells, the sensing circuit comprising a continuous severable component; and
   a monitoring unit connected to the sensing circuit,
   wherein the monitoring unit comprises a continuity detector arranged to detect a break in continuity of the continuous severable component, and
   the continuous severable component comprises a trace on a circuit board.

2. A battery module according to claim 1, wherein the monitoring unit is arranged to produce an alarm signal when a break in continuity of the continuous severable component is detected.

3. A battery module according to claim 1, wherein the continuous severable component extends across a vent path of each of the plurality of battery cells.

4. A battery module according to claim 1, wherein the continuous severable component is arranged to be severed by a venting action of a cell undergoing a thermal event.

5. A battery module according to claim 1, wherein the continuous severable component is an electrical conductor.

6. A battery module according to claim 5, wherein the monitoring unit is arranged to apply an electrical signal to the electrical conductor, and to detect an open circuit in the electrical conductor.

7. A battery module according to claim 1, wherein the circuit board comprises a plurality of vent holes, each vent hole associated with a battery cell, and the continuous trace spans a plurality of vent holes.

8. A battery module according to claim 1, wherein the trace includes a stress concentration feature where it spans a vent hole.

9. A battery module according to claim 8 wherein the stress concentration feature comprises at least one notch in the trace.

10. A battery module according to claim 1, further comprising a laminated busbar, wherein the circuit board is part of the laminated busbar.

11. A battery module according to claim 1, wherein the circuit board is arranged to bring electrical signals from the battery cells to a battery management unit.

12. A battery module according to claim 1, wherein the monitoring unit is part of a battery management unit.

13. A battery module according to claim 1, wherein the monitoring unit is arranged to receive an input from at least one other sensor.

14. A battery module according to claim 1, the battery module comprising a plurality of sensing circuits.

15. A battery module according to claim 1, wherein the plurality of battery cells are stacked, and each cell is orientated such that a vent path is in a direction of the sensing circuit.

16. A method of detecting a thermal event in a battery module comprising a plurality of battery cells, the method comprising:

monitoring a sensing circuit, the sensing circuit comprising a continuous severable component extending across the plurality of battery cells;

detecting a break in continuity of the continuous severable component; and producing an alarm signal when a break in continuity of the continuous severable component is detected, wherein the continuous severable component comprises a trace on a circuit board.

17. A battery pack comprising:
a plurality of battery cells;
a sensing circuit extending across the plurality of battery cells, the sensing circuit comprising a continuous severable component; and
a monitoring unit connected to the sensing circuit,
wherein the monitoring unit comprises a continuity detector arranged to detect a break in continuity of the continuous severable component, and the continuous severable component comprises a trace on a circuit board.

* * * * *